(12) United States Patent
Takeuchi et al.

(10) Patent No.: US 7,256,107 B2
(45) Date of Patent: Aug. 14, 2007

(54) DAMASCENE PROCESS FOR USE IN FABRICATING SEMICONDUCTOR STRUCTURES HAVING MICRO/NANO GAPS

(75) Inventors: Hideki Takeuchi, El Cerrito, CA (US); Emmanuel P. Quevy, Berkeley, CA (US); Tsu-Jae King, Fremont, CA (US); Roger T. Howe, Martinez, CA (US)

(73) Assignee: The Regents of the University of California, Oakland, CA (US)

( * ) Notice: Subject to any disclaimer, the term of this patent is extended or adjusted under 35 U.S.C. 154(b) by 113 days.

(21) Appl. No.: 11/121,690

(22) Filed: May 3, 2005

(65) Prior Publication Data

US 2005/0250236 A1 Nov. 10, 2005

Related U.S. Application Data

(60) Provisional application No. 60/568,404, filed on May 4, 2004.

(51) Int. Cl.
*H01L 21/46* (2006.01)
*H01L 21/78* (2006.01)
*H01L 21/301* (2006.01)

(52) U.S. Cl. ............... 438/460; 438/113; 438/933; 257/E21.017; 257/E21.127; 257/E21.229; 257/E21.237; 257/E21.304

(58) Field of Classification Search ........... 438/460, 438/113, 197, 475, 680, 692, 706, 723, 752, 438/753, 756, 933
See application file for complete search history.

(56) References Cited

U.S. PATENT DOCUMENTS

| 5,976,994 | A | * | 11/1999 | Nguyen et al. ............. 438/795 |
| 6,027,630 | A | | 2/2000 | Cohen |
| 6,391,674 | B2 | * | 5/2002 | Ziegler .................. 438/52 |
| 2006/0011486 | A1 | | 1/2006 | Lockard et al. |

OTHER PUBLICATIONS

High Q VHF . . . Resonators, Dec. 2000, USA, Nguyen, Hsu, and Clark.*
Clark et al., "*High-Q VHF Micromeechanical Contour-Mode Disk Resonators*", Technical Digest, IEEE Int. Electron Devices Meeting, San Francisco, CA, Dec. 11-13, 2000, pp. 493-496.
Quevy et al., "*Poly-Sige High Frewuency Resonators Based on Lithographic Definition of Nano-Gap Lateral Transducers*", Solid State Sensor Workshop, Hilton Head Island, Jun. 6-10, 2004.

* cited by examiner

*Primary Examiner*—David Nhu
(74) *Attorney, Agent, or Firm*—John P. O'Banion; Henry K. Woodward

(57) ABSTRACT

In fabricating a microelectromechanical structure (MEMS), a method of forming a narrow gap in the MEMS includes a) depositing a layer of sacrificial material on the surface of a supporting substrate, b) photoresist masking and at least partially etching the sacrificial material to form at least one blade of sacrificial material, c) depositing a structural layer over the sacrificial layer, and d) removing the sacrificial layer including the blade of the sacrificial material with a narrow gap remaining in the structural layer where the blade of sacrificial material was removed.

19 Claims, 10 Drawing Sheets

DAMASCENE PROCESS FOR USE IN FABRICATING SEMICONDUCTOR STRUCTURES HAVING MICRO/NANO GAPS

CROSS REFERENCE TO RELATED APPLICATIONS

This application claims priority to U.S. Provisional Patent Application No. 60/568,404, filed May 4, 2004, entitled "GERMANIUM BLADE DAMASCENE PROCESS FOR THE FABRICATION OF MICRO/NANOMECHANICAL RESONATORS" which is incorporated herein for all purposes.

GOVERNMENT RIGHTS

The U.S. government has rights in the disclosed invention pursuant to DARPA/NMASP Grant No. N 66001-01-1-8967 to the University of California.

BACKGROUND OF THE INVENTION

This invention relates generally to the fabrication of semiconductor microelectromechanical structures (MEMS) and more particularly the invention relates to the fabrication of structures such as mechanical resonators which require narrow gaps between a resonator body and drive and sense electrodes.

Micromachined resonators are promising as on-chip replacements for discrete filters and oscillators which are presently implemented using off-chip quartz and surface-acoustic-wave (SAW) devices in wireless communication systems. The monolithic integration of control, amplification and signal processing electronics with radio frequency microelectromechanical devices (RF MEMS) also reduces parasitic capacitances and inductances as well as overall system power consumption. Recent progress toward a low-thermal-budget polycrystalline silicon-germanium (poly-SiGe) MEMS technology promises to make possible the modular co-fabrication of high performance surface-micromachined structures on top of completed CMOS wafers. However, a detailed process integration scheme for poly-SiGe resonator fabrication—particularly one that provides ultra-narrow lateral gaps between the resonator and drive/sense electrodes—is needed.

There are several process requirements for post-CMOS integration of RF resonators. First, the MEMS fabrication thermal process budget must be carefully designed in order to retain the performance and reliability of the CMOS electronics. Interconnect reliability, rather than transistor performance, limits the post processing temperature, which should not exceed 450° C. High quality poly-SiGe structural layers with Ge content greater than ~60% can be deposited by conventional low-pressure chemical vapor deposition without exceeding this temperature limit. Second, the metallization stack of the underlying electronics must be protected from chemical attack during the microstructure release etch. The use of Ge rather than SiO2 as the sacrificial material is advantageous because it can be rapidly etched in a heated H2O2 solution which does not attack oxide, metal, poly-Si, or poly-SiGe with a Ge content less than ~70%. Third, extremely small (sub-100 nm) electrode gaps are needed in order to achieve low motional resistances, hence low insertion losses. For the definition of nanoscale lateral gaps, a sidewall sacrificial oxide spacer process has already been developed for poly-Si MEMS technology. In this process, the poly-Si electrode layer (which is deposited after the sacrificial spacers are formed) must be etched with high selectivity to the sacrificial oxide, in order to clear it completely along the sidewalls of the structural poly-Si layer in the areas where the electrode layer must be removed. Because Ge etches more quickly (by a factor of ~3) than poly-SiGe or poly-Si in a standard Cl2/HBr dry-etch chemistry, the sidewall spacer process cannot be used if Ge is employed as the sacrificial material, however.

SUMMARY OF THE INVENTION

The invention utilizes a damascene process to define gaps in semiconductor MEMS structure such as micromachined resonators which have gaps separating a resonator body and drive and sense electrodes juxtaposed with but spaced from the resonator body.

More particularly, a thin blade is formed in a sacrificial material with the blade functioning to define a gap between two material bodies formed to abut the blade. After forming the two bodies, the blade is selectively removed such as by a preferential etch so that a gap remains between and separating the two bodies.

The invention is particularly applicable in fabricating a bulk-longitudinal resonator and will be described with reference to the fabrication of such a structure. However, this description of the invention is illustrative of the invention and not limiting the invention.

The invention and objects and features thereof will be more readily apparent from the following detailed description and appended claims when taken with the drawings.

DETAILED DESCRIPTION OF THE PREFERRED EMBODIMENTS

Figure 6:
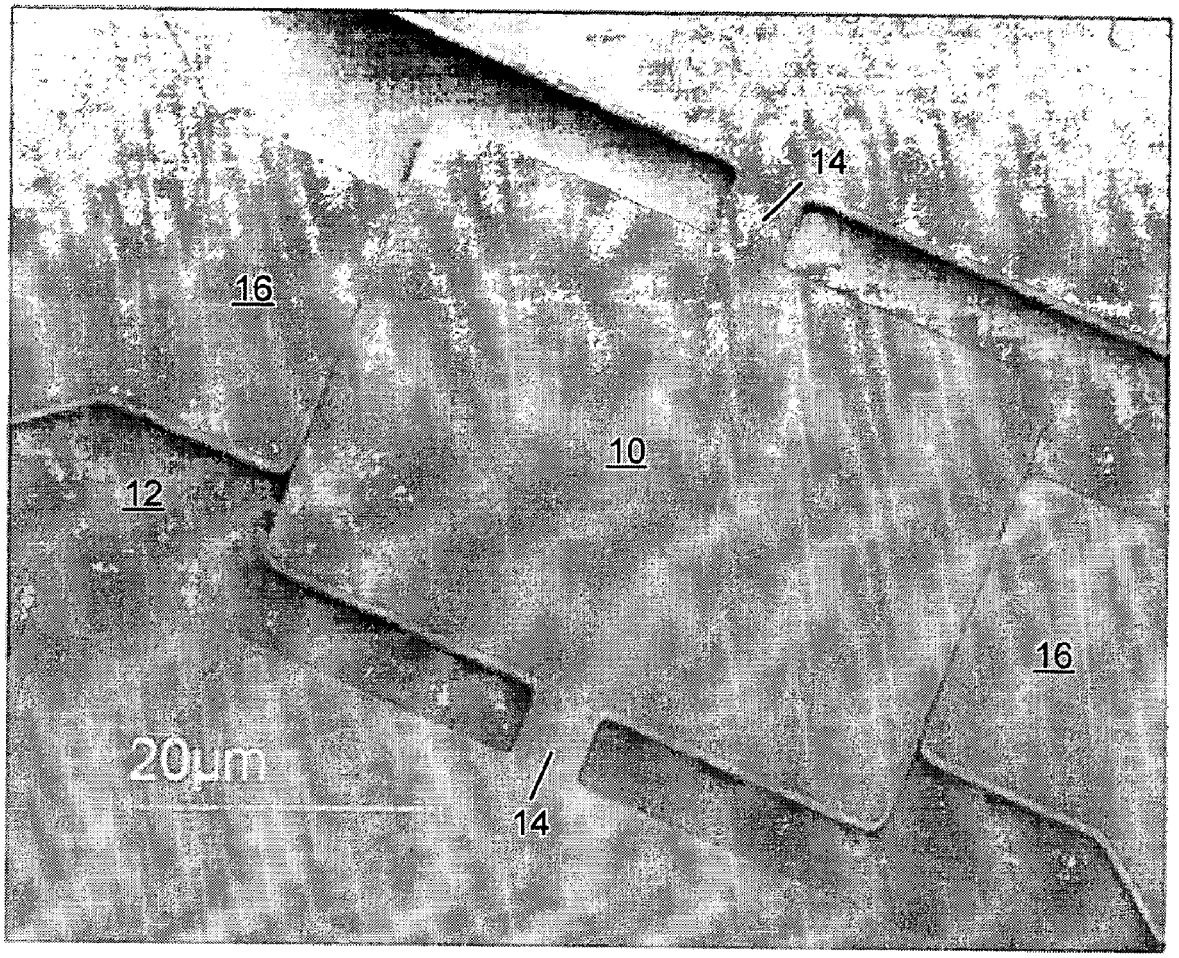
FIG. 6 is a SEM picture of bulk-longitudinal resonator.

The invention will be described with reference to process steps useful in fabricating a bulk-longitudinal resonator structure, such as shown in FIG. 6. Here a bulk resonator body 10 of suitable semiconductor material such as SiGe is fabricated on a substrate 12 with anchors 14 on opposing sides of resonator body 10 supporting body 10 above substrate 12. Alternatively, an anchor centrally disposed under body 10 can support the body above the substrate (not shown). Drive and sense electrodes 16 are juxtaposed with resonator body 10 and are spaced therefrom by gaps on the order of 100 nanometers.

FIG. 1 illustrates the fabrication process; scanning electron microscopy (SEM) pictures at various steps are presented in FIG. 2. A Si wafer covered with 1-μm CVD-SiO$_2$ was used as the starting substrate. For simplicity, a two-mask process was used. First, a 2-μm thick in-situ boron doped poly-Ge sacrificial film was deposited by LPCVD (350° C., 2 hr deposition) and patterned using i-line lithography. The structures include 0.5 μm minimum width lines to define the transducer's lateral gaps (FIG. 1a). Photoresist ashing in O$_2$ plasma was used to reduce the minimum line width to 50 nm (FIG. 1b and FIG. 2a). The photoresist pattern was then transferred to the Ge layer using a HBr/Cl$_2$ in a transformer-coupled plasma (TCP) etcher. FIG. 2b shows SEM images of a high-aspect-ratio (10-20) Ge blade. Note that sidewall taper in the etchec Ge structures, due mainly to a tapered photoresist profile, must be minimized for peak resonator performance. (Sidewall taper is undesirable for the aforementioned sidewall sacrificial oxide spacer process as well.) To avoid any potential adhesion issue fo the narrow Ge-blades on SiO$_2$, the Ge was not etched all the way down to the underlying SiO$_2$; rather, a second mask was used to define anchoring contacts to the SiO$_2$ (FIG. 1c). Next, a 2.2 μm-thick in-situ boron-doped poly-Si$_{0.35}$Ge$_{0.65}$ structural layer was deposited by LPCVD (425° C., 400 mtorr, SiH$_4$/ GeH$_4$B$_2$H$_6$ [10% in H$_2$ ]=100/60/60 sccm, 4 hr 40 min. deposition) as shown in FIGS. 1d and 2c. This deposition step accounts for the majority of the total thermal process budget. FIG. 2d shows that the poly-Si$_{0.35}$Ge$_{0.65}$ is deposited comfornally over the Ge blade. After chemical mechanical polishing (CMP) of the poly-Si$_{0.35}$Ge$_{0.65}$ layer (FIG. 1e) the sacrificial poly-Ge layer was removed in H$_2$O$_2$ at 90° C. (FIG. 1f). FIG. 2e shows an SEM image of a fabricated Double-Ended Tuning Fork (DETF) resonator. FIG. 2f shows a cross-sectional SEM image of the nanoscale gap. Due to high compressive stress and strain gradient in the poly-Si$_{035}$Ge$_{065}$ film, the gap is reduced to almost zero and the resonator is vertically displaced from the electrodes by 100 nm, respectively.

This new process provides significant advantages for manufacturing. First, a single deposited layer is used to form the resonator structure and drive/sense electrodes, so that there is no need for a highly selective etch process in order to avoid the formation of unwanted "stringers" along the resonator sidewalls. Because the number of film deposition steps is reduced, the thermal process budget is substantially reduced. Second, nanoscale lateral gaps are achieved by lithographically patterning ultra narrow lines rather than spaces. Line patterning technology for ~100 nm features is well established, as 50 nm physical gate-length transistors are now used in products at the 90 nm CMOS technology node. This is because the well-controlled formation of ultra-narrow line widths is feasible using photoresist ashing or hard-mask trimming techniques. Also, because of the unique etching characteristics of Ge, the width of a Ge blade after it is formed by dry etching can be further reduced in a controllable manner, in hot (~90° C.) deionized water. Finally, the unconstrained placement of lateral gaps is an additional advantage of this method as compared to the sidewall spacer process.

Figure 1A:
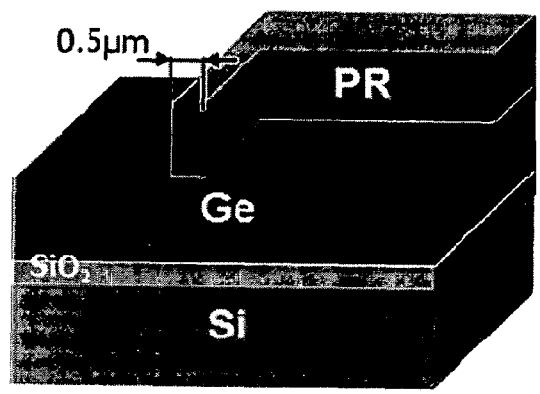
FIG. 1a-1f are outlines of the 2-mask Germanium Blade Damascene Process which provides ultra-narrow gaps.
Figure 1B:
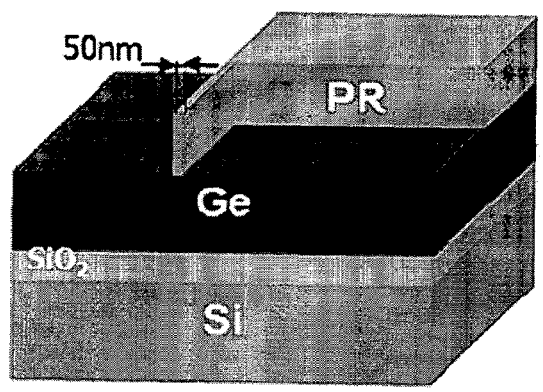
Figure 1C:
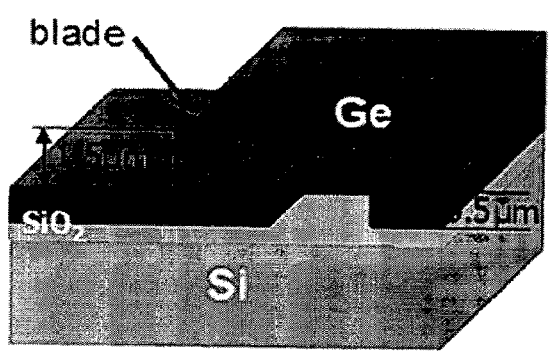
Figure 1D:
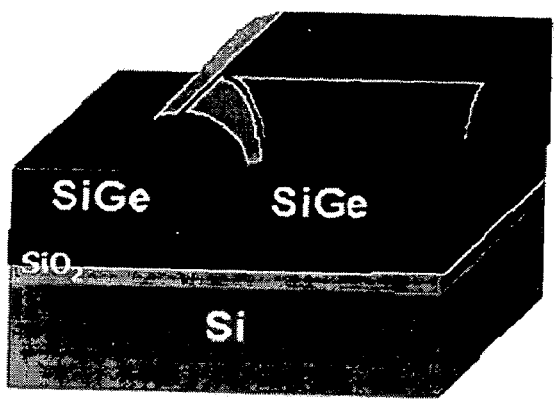
Figure 1E:
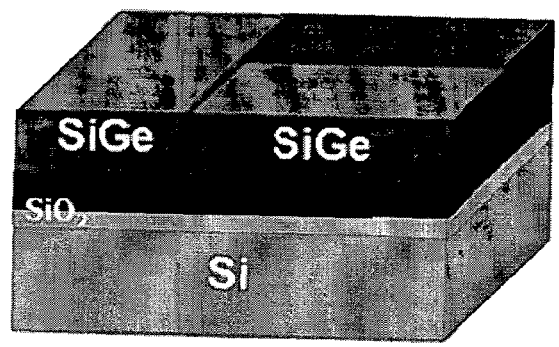
Figure 1F:
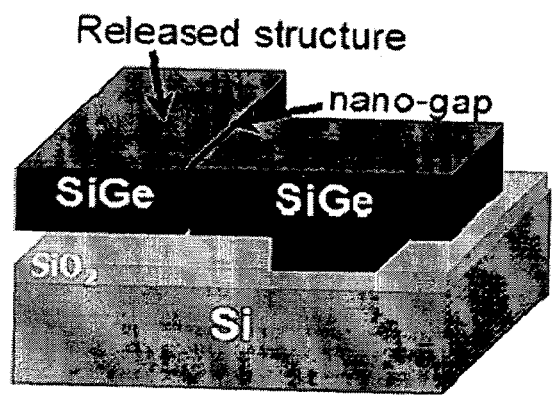
Figure 2A:
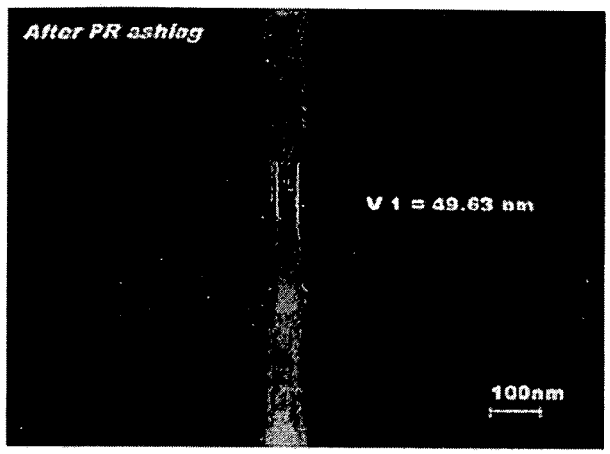
FIGS. 2a-2f are SEM pictures corresponding to various steps depicted in FIG. 1 in the case of a double-ended tuning fork (DETF): (a) 50 nm line definition by lithography and photoresist ashing; (b) High-aspect-ratio Ge blade; top view and (d) cross-section after SiGe structural layer deposition; (e) Released DETF top view and (f) cross-section.
Figure 2B:
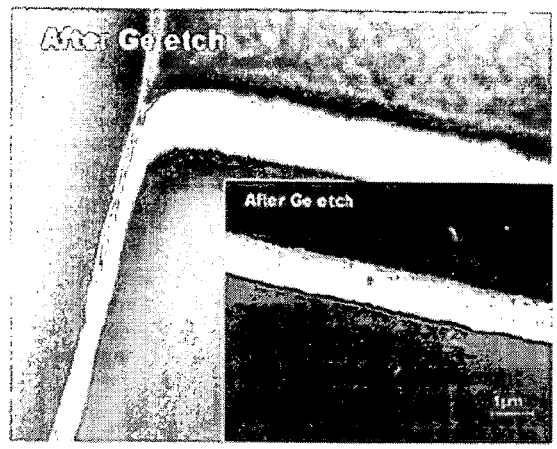
Figure 2C:
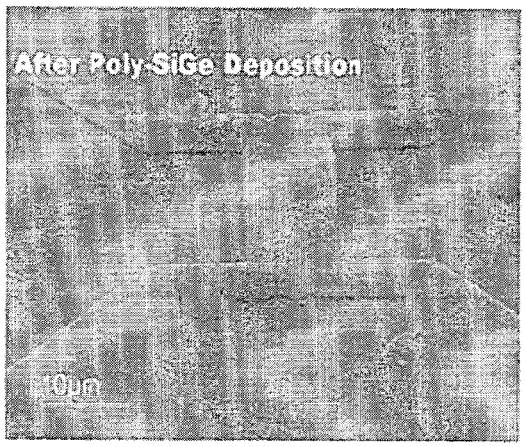
Figure 2D:
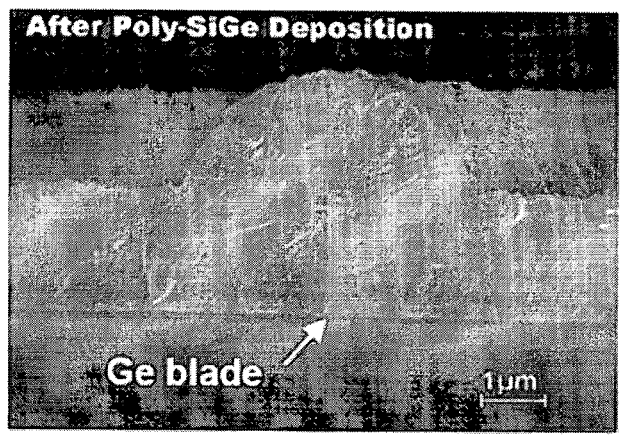
Figure 2E:
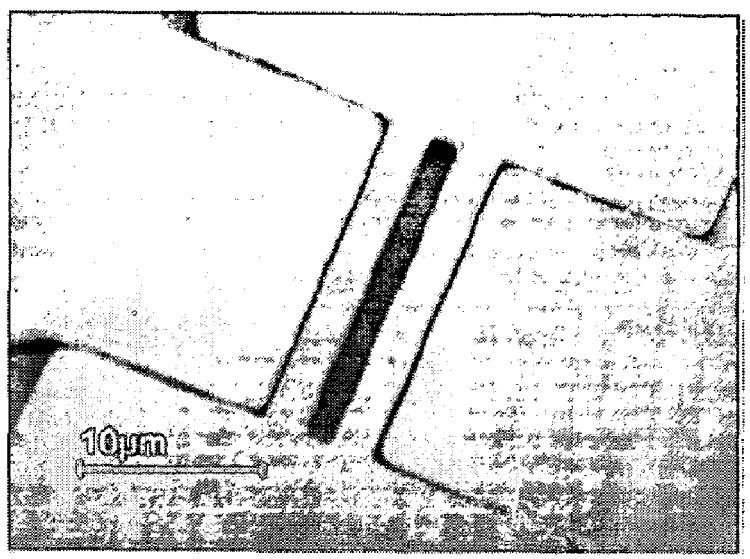
Figure 2F:
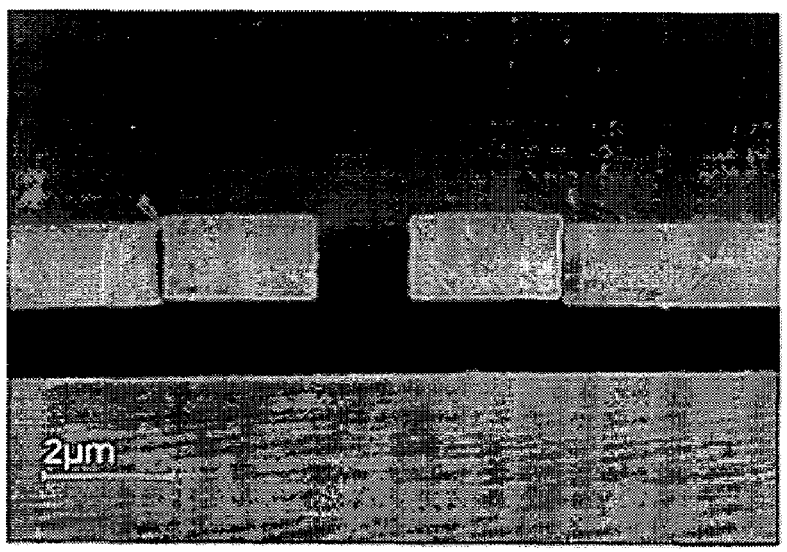
Figure 3A:
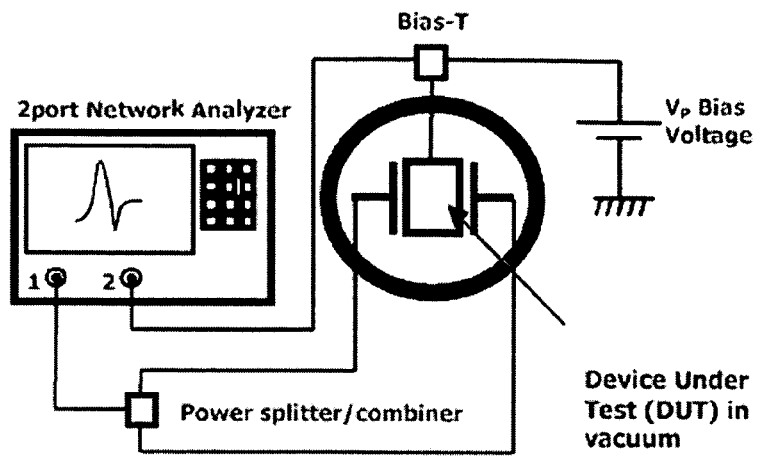
FIGS. 3a-3c are (a) Experimental set-up for Transmission Measurement with Differential Drive Configuration (b) and Differential Sense Configuration (c).
Figure 3B:
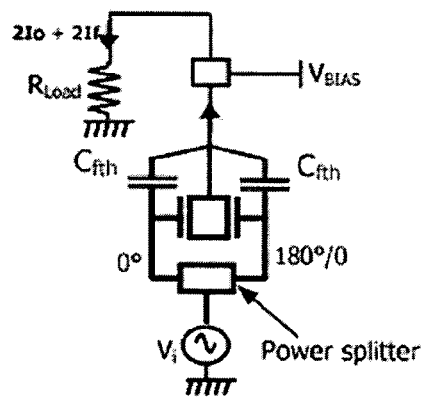
Figure 3C:
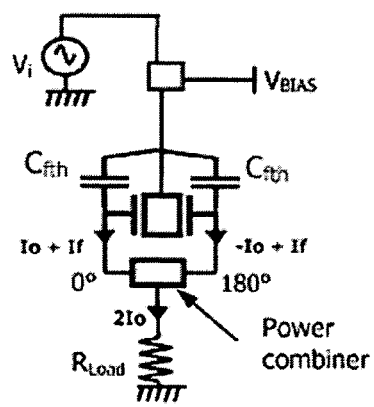

Devices fabricated using the 2-mask damascene Ge-blade process were characterized using various methods:

2-Port Measurement Method:

The main problem encountered is testing of MEMS resonators is the feed-through capacitance. Indeed, using direct 2-port measurement of the 24 MHz resonator in FIG. 2e, the peak height achievable was only 0.5 dB. To address this problem, we used a different drive/sense scheme as illustrated in FIGS. 3a-3c, the proof mass is used either as a drive or sense element, allowing better efficiency but higher direct feed-through via capacitive transduction. The use of a power combiner/splitter adds flexibility, allowing actuation of both symmetric/asymmetric modes, and providing feed-through cancellation for the asymmetric differential mode in particular.

Figure 4A:
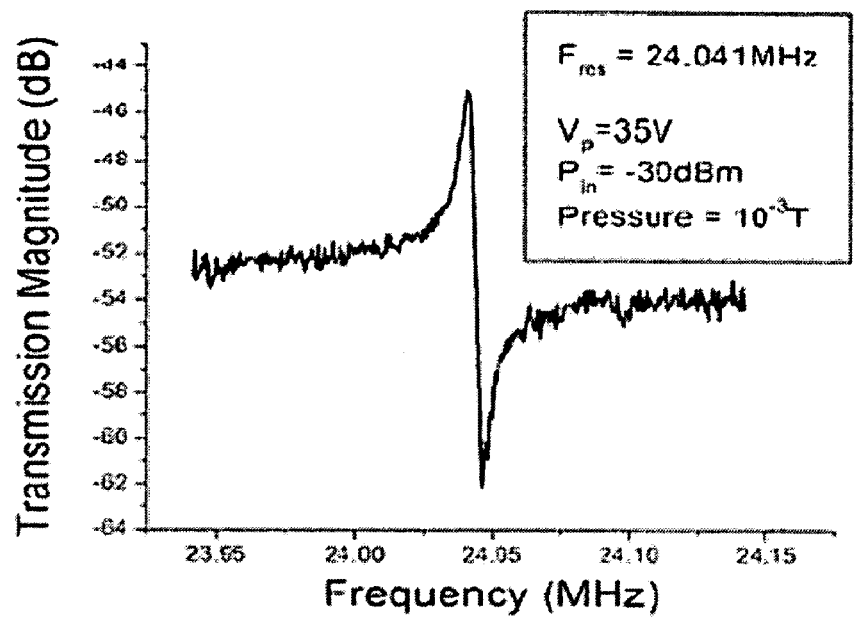
FIGS. 4a, 4b illustrate Transmission Magnitude of the Double-Ended Tuning Fork shown in FIG. 2.e, in the case of Differential Sense Configuration for the asymmetric mode (a), and RF/LO technique for the symmetric mode (b).

Using the differential drive/sense scheme, the transmission characteristic of the same DETF is shown in FIG. 4a, exhibiting a resonance peak increased to 8 dB at 24.05 MHz, and a quality factor of 4800. Based on frequency pulling extraction, the effective gap was determined to be 295 nm, which accounts for the low transduction efficiency. This gap broadening can be attributed primarily to insufficient etch selectivity (of Ge vs. Si$_{0.35}$Ge$_{0.65}$) during the long release etch in H$_2$O$_2$, which can be remedied by using a structural layer with Ge content below 65%. Poor critical dimension (CD) control on the blade definition mask may also have contributed to the gap broadening.

RF/LO Technique.

Figure 5:
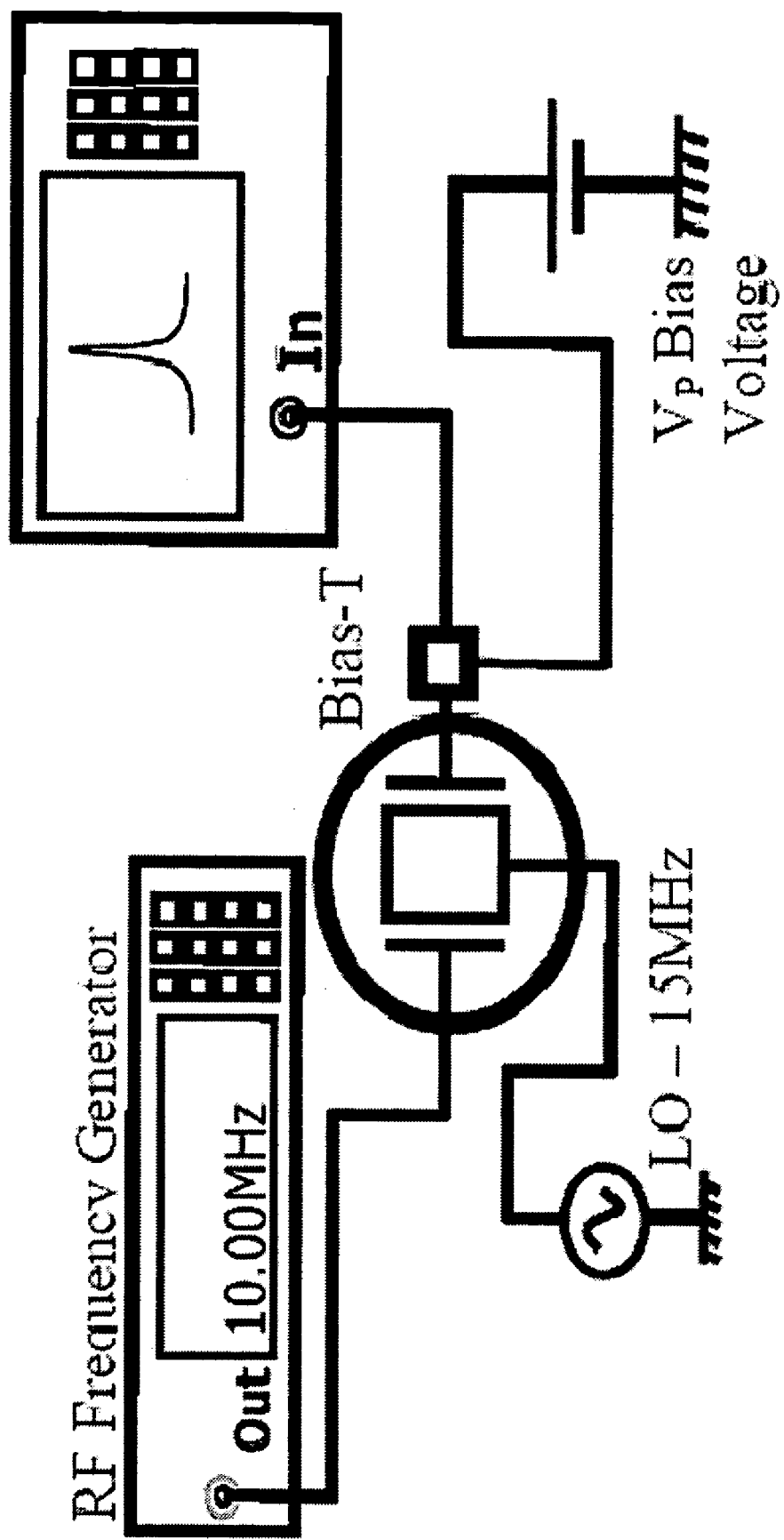
FIG. 5 is an experimental set-up for RF/LO measurement technique.

The RF/LO technique shown in FIG. 5 was used to perform characterization of fabricated device at higher frequencies. Indeed, this technique takes advantage of the capacitive non-linear of the transducer to perform mixing and thus further minimize the influence of any parasitic feed-through in the resonator band.

Figure 4B:
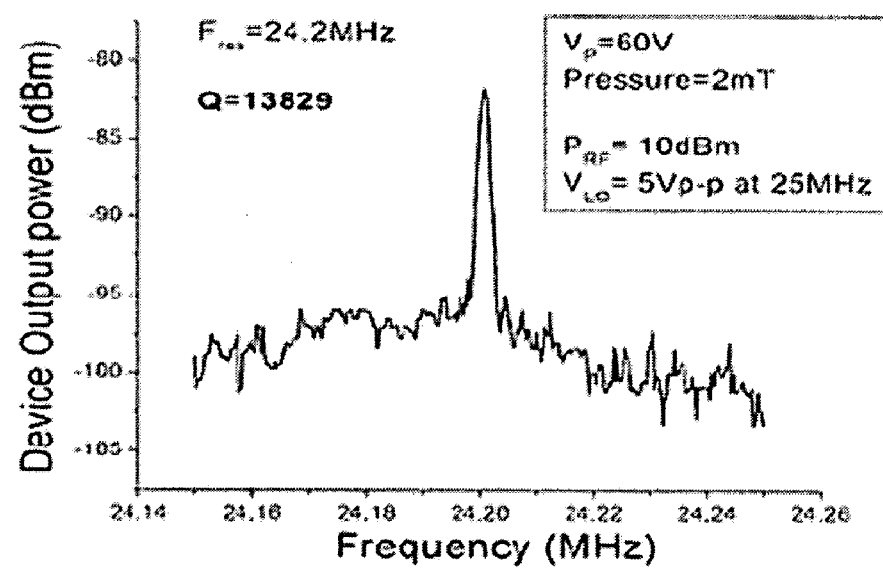

In the case of the 24 MHz tuning fork, this technique was used to characterize the symmetric mode and to extract an expectedly higher Q of 13,800 (FIG. 4b).

Figure 7A:
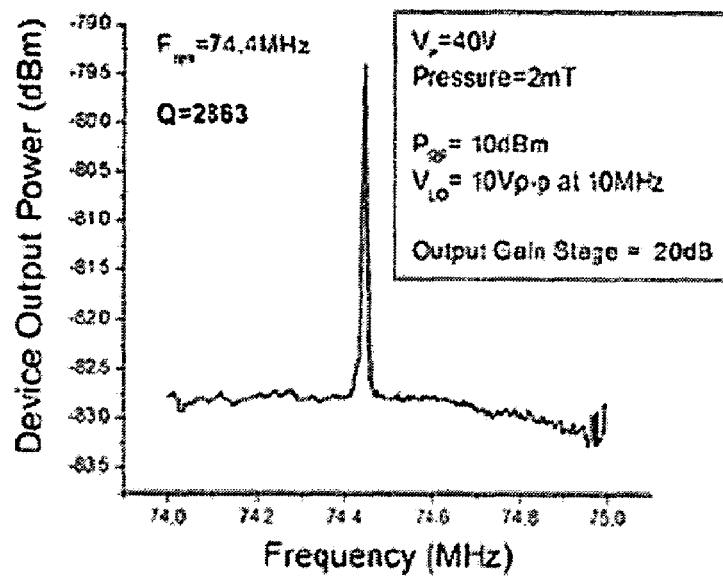
FIGS. 7a, 7b illustrate device output power of the Bulk Longitudinal Resonator shown in FIG. 6 using the RF/LO measurement technique: (a) Fundamental Mode (b) Third Harmonic.
Figure 7B:
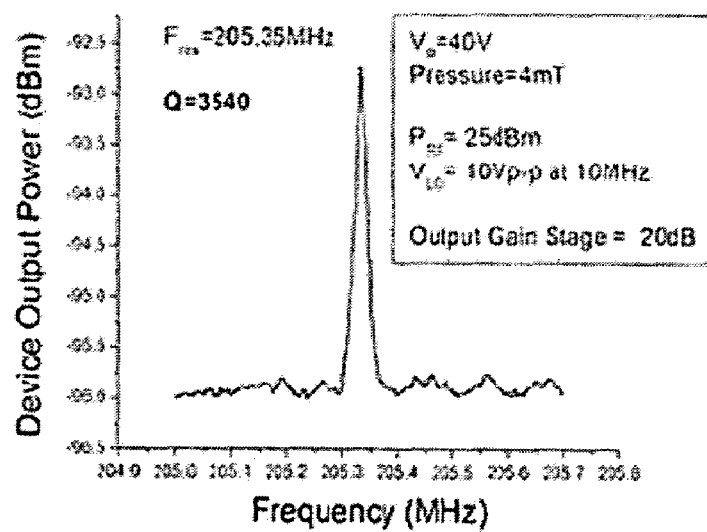

A 40 μm-long and 32 μm-wide bulk-longitudinal resonator (FIG. 6) was also characterized using this technique. A 74.4 MHz resonance was observed for the fundamental mode, while the third harmonic mode was visible at 205 MHz, as shown in FIGS. 7a and 7b. The quality factors were measured to be 2,900 and 3,500 respectively.

Temperature Drift.

Figure 8:
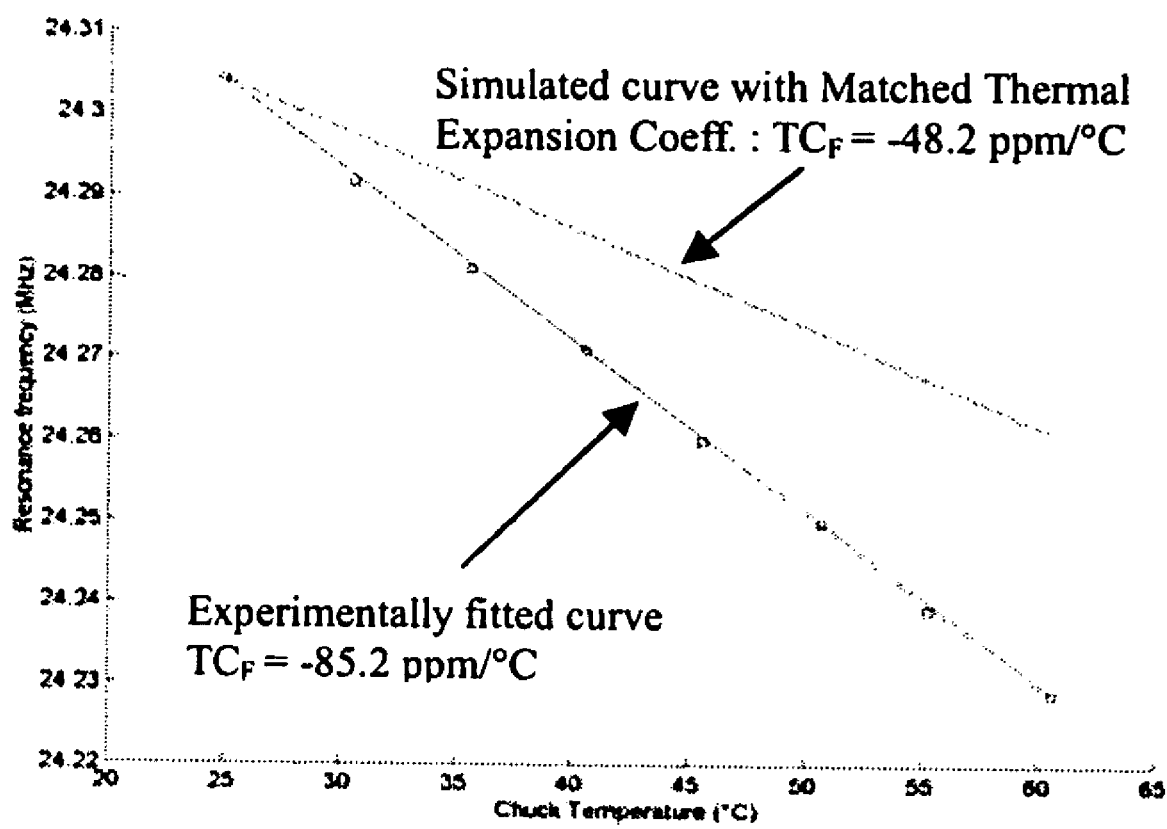
FIG. 8 is a plot of measured and simulated frequency dependence versus temperature for a DEFT.

FIG. 8 presents the temperature dependence of the DETF, which exhibits TCF=−85 ppm/° C., greatly influenced by the compressive stress due to thermal-expansion mismatch between the SiGe structure and Si substrate. Using a simple model, the corresponding TCF for SiGe was extracted to be −104 ppm/° C. On the same plot, a simulated curve shows the benefit of matching the thermal expansion coefficients of the substrate and the structure, resulting in a lower TCF of −48 ppm/° C. Although these values are higher than for poly-Si, it is possible to take advantage of such a mismatch to integrate efficient temperature-sensing structures for compensation purpose.

A Ge-Blade Damascene Process has been described and successfully applied to fabricate a high-frequency DETF resonator. Due to its low thermal budget, HF-free release process, and highly-planar surface topography, this new process is particularly applicable for post-CMOS integration of nano-mechanical resonators applicable for RF communication systems.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a microelectromechanical structure (MEMS) including a narrow gap in the MEMS, comprising:
    (a) depositing a layer of sacrificial material on a surface of a supporting substrate;
    (b) photoresist masking and at least partially etching the sacrificial material to form a blade of sacrificial material;
    (c) depositing a structural layer over the sacrificial material; and
    (d) removing the sacrificial material, including the blade of sacrificial material, with a narrow gap remaining in the structural layer where the blade of sacrificial material was removed.

2. The method of claim 1, further comprising after step (b):
    (e) photoresist masking the sacrificial material where structural anchors are to be formed; and
    (f) etching the sacrificial material at the structural anchor location before step (c).

3. The method of claim 2 wherein step (d) releases the structural layer with structural anchors supporting the structural layer on the supporting substrate.

4. The method of claim 3 wherein step (d) includes selectively etching the sacrificial material.

5. The method of claim 4 wherein the supporting substrate comprises silicon, the sacrificial material comprises germanium, and the structural material comprises silicon-germanium.

6. The method of claim 5 wherein the supporting substrate comprises an integrated circuit.

7. The method of claim 6 wherein the MEMS comprises a resonator structure, a drive electrode, and a sense electrode.

8. The method of claim 1 wherein the MEMS comprises a resonator structure, a drive electrode, and a sense electrode.

9. The method of claim 8 wherein the supporting substrate comprises an integrated circuit.

10. The method of claim 9 wherein the supporting substrate comprises silicon, the sacrificial material comprises germanium, and the structural material comprises silicon-germanium.

11. A method of fabricating a micro/nanomechanical resonator on a substrate comprising:
    (a) depositing a sacrificial layer on a surface of the substrate;
    (b) photoresist masking and at least partially etching the sacrificial layer to form a blade of sacrificial material;
    (c) photoresist masking the sacrificial layer except where structural anchors are to be formed;
    (d) etching the sacrificial layer at the structural anchor locations;
    (f) depositing a structural layer over the sacrificial layer and in the structural anchor locations with the blade separating portions of the structural layers; and
    (g) removing the sacrificial layer, including the blade of sacrificial material, to release a resonator structure in the structural layer supported by the structural anchors with a gap remaining where the blade of sacrificial material was removed.

12. The method as defined by claim 11 wherein the substrate comprises an integrated circuit.

13. The method as defined by claim 12 wherein the sacrificial layer comprises germanium and the structural layer comprises polycrystalline silicon germanium.

14. The method as defined by claim 13 wherein the integrated circuit comprises CMOS devices.

15. The method of claim 14 wherein the resonator structure includes a drive electrode, a sense electrode, and a bulk lateral resonator between the drive and sense electrodes.

16. The method of claim 15 wherein step (b) forms two germanium blades which define ultra-narrow lateral gaps between the bulk lateral resonator and the drive and sense electrodes.

17. The method of claim 16 wherein step (g) is preceded by the step (h) comprising planarizing the polycrystalline silicon germanium layer.

18. The method of claim 17 wherein the germanium blades are about 100 nm or less in width.

19. The method of claim 11 wherein step (g) is preceded by the step (h) comprising planarizing the polycrystalline silicon germanium layer.

* * * * *